United States Patent
Uziel et al.

(10) Patent No.: US 6,827,816 B1
(45) Date of Patent: Dec. 7, 2004

(54) IN SITU MODULE FOR PARTICLE REMOVAL FROM SOLID-STATE SURFACES

(75) Inventors: Yoram Uziel, Yodfat (IL); David Yogev, Nesher (IL); Ehud Poles, Kfar Vradim (IL); Amir Wachs, Haifa (IL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/721,167

(22) Filed: Nov. 22, 2000

Related U.S. Application Data (63) Continuation-in-part of application No. PCT/IL99/00701, filed on Dec. 23, 1999.
(60) Provisional application No. 60/195,867, filed on Apr. 7, 2000, and provisional application No. 60/172,299, filed on Dec. 16, 1999.

(30) Foreign Application Priority Data

Dec. 23, 1999 (IL) .................................. PCT/IL99/00701

(51) Int. Cl.[7] .......................... H05H 1/00; B23K 26/00
(52) U.S. Cl. ........................ 156/345.39; 156/345.1; 219/121.78; 219/121.68
(58) Field of Search ................... 156/345.39, 345.5, 156/345.24, 345.1; 219/121.78–121.79, 121.8, 121.68; 216/9.4, 65; 134/1.3, 1

(56) References Cited

U.S. PATENT DOCUMENTS 4,987,286 A * 1/1991 Allen ..................... 219/121.68
5,023,424 A * 6/1991 Vaught .................... 219/121.6
5,531,857 A * 7/1996 Engelsberg et al. ...... 156/345.5
5,634,230 A * 6/1997 Maurer ....................... 15/1.51
5,821,175 A * 10/1998 Engelsberg ................. 438/795
6,048,588 A   4/2000 Engelsberg

FOREIGN PATENT DOCUMENTS

| EP | 0 764 478 | 3/1997 |
| JP | 10 216664 | 8/1998 |
| WO | WO 00/38935 | 7/2000 |

OTHER PUBLICATIONS

International Search Report dated Mar. 18, 2002, which issued during the prosecution of Applicant's PCT Patent Application No.: PCT/IL01/01073, which corresponds to the present application.

* cited by examiner

Primary Examiner—Parviz Hassanzadeh
(74) Attorney, Agent, or Firm—Olson & Hierl, Ltd.

(57) ABSTRACT

Apparatus and a method for removing particles from the surface of a substrate include determining respective position coordinates of the particles on the surface. A beam of electromagnetic energy is directed via an optical cleaning arm at the coordinates of each of the particles in turn, such that absorption of the electromagnetic energy at the surface causes the particles to be dislodged from the surface substantially without damage to the surface itself.

20 Claims, 9 Drawing Sheets

IN SITU MODULE FOR PARTICLE REMOVAL FROM SOLID-STATE SURFACES

CROSS-REFERENCE TO RELATED APPLICATIONS

This application claims the benefit of U.S. Provisional Patent Application No. 60/172,299, filed Dec. 16, 1999, and U.S. Provisional Patent Application No. 60/195,867, filed Apr. 7, 2000, which are incorporated herein by reference. This application further is a Continuation In Part of PCT Patent Application PCT/IL99/00701, filed Dec. 23, 1999, which is incorporated herein by reference.

FIELD OF THE INVENTION

The present invention relates generally to processing of semiconductor devices, and specifically to methods and apparatus for removal of foreign particles and contaminants from solid-state surfaces, such as semiconductor wafers and lithography masks.

BACKGROUND OF THE INVENTION

Removal of particles and contaminants from solid state surfaces is a matter of great concern in integrated circuit manufacture. This concern includes, but is not limited to, semiconductor wafers, printed circuit boards, component packaging, and the like. As the trend to miniaturize electronic devices and components continues, and critical dimensions of circuit features become ever smaller, the presence of even a minute foreign particle on a substrate wafer during processing can cause a fatal defect in the circuit. Similar concerns affect other elements used in the manufacturing process, such as masks and reticules.

Various methods are known in the art for stripping and cleaning foreign matter from the surfaces of wafers and masks, while avoiding damage to the surface itself. For example, U.S. Pat. No. 4,980,536, whose disclosure is incorporated herein by reference, describes a method and apparatus for removal of particles from solid-state surfaces by laser bombardment. U.S. Pat. Nos. 5,099,557 and 5,024,968, whose disclosures are also incorporated herein by reference, describe methods and apparatus for removing surface contaminants from a substrate by high-energy irradiation. The substrate is irradiated by a laser with sufficient energy to release the particles, while an inert gas flows across the wafer surface to carry away the released particles.

U.S. Pat. No. 4,987,286, whose disclosure is likewise incorporated herein by reference, describes a method and apparatus for removing minute particles (as small as submicron) from a surface to which they are adhered. An energy transfer medium, typically a fluid, is interposed between each particle to be removed and the surface. The medium is irradiated with laser energy and absorbs sufficient energy to cause explosive evaporation, thereby dislodging the particles.

One particularly bothersome type of contamination that is found on semiconductor wafers and lithography masks is residues of photoresist left over from a preceding photolithography step. U.S. Pat. No. 5,114,834, whose disclosure is incorporated herein by reference, describes a process and system for stripping this photoresist using a high-intensity pulsed laser. The laser beam is swept over the entire wafer surface so as to ablate the photoresist. The laser process may also be effected in a reactive atmosphere, using gases such as oxygen, ozone, oxygen compounds, nitrogen trifluoride ($NF_3$), etc., to aid in the decomposition and removal of the photoresist.

Various methods are known in the art for localizing defects on patterned wafers. A summary of these methods is presented in an article entitled "Defect Detection on Patterned Wafers," in *Semiconductor International* (May 1997), pp. 64–70, which is incorporated herein by reference. There are many patents that describe methods and apparatus for defect localization, for example, U.S. Pat. Nos. 5,264,912 and 4,628,531, whose disclosures are incorporated herein by reference. Foreign particles are one type of defects that can be detected using these methods.

U.S. Pat. No. 5,023,424, whose disclosure is incorporated herein by reference, describes a method and apparatus using laser-induced shock waves to dislodge particles from a wafer surface. A particle detector is used to locate the positions of particles on the wafer surface. A laser beam is then focused at a point above the wafer surface near the position of each of the particles, in order to produce gas-borne shock waves with peak pressure gradients sufficient to dislodge and remove the particles. It is noted that the particles are dislodged by the shock wave, rather than vaporized due to absorption of the laser radiation. U.S. Pat. No. 5,023,424 further notes that immersion of the surface in a liquid (as in the above-mentioned U.S. Pat. No. 4,987,286, for example) is unsuitable for use in removing small numbers of microscopic particles.

Various methods are known in the art of surface contamination control using integrated cleaning. A summary of these methods is presented in an article entitled "Surface Contamination Control Using Integrated Cleaning" in *Semiconductor International* (Jun. 1998), pp. 173–174, which is incorporated herein by reference.

SUMMARY OF THE INVENTION

It is an object of some aspects of the present invention to provide methods and apparatus for efficient removal of contaminants from solid-state surfaces, and particularly for removal of microscopic particles from semiconductor wafers and other elements used in semiconductor device production. The wafers may be bare, or they may have layers formed on their surface, whether patterned or unpatterned.

It should be noted that a substrate is henceforth broadly defined as any solid-state surface such as a wafer, which requires at least one contaminant or particle to be removed from its surface. It should be noted further that the word particle is used broadly to define any contaminant or other element, which requires removal from a substrate surface.

It is a further object of some aspects of the present invention to provide improved methods and apparatus for targeted removal of contaminant particles from a surface based on prior localization of the particles.

In preferred embodiments of the present invention, a cleaning module is employed to remove particles from a substrate surface. The cleaning module comprises a moving chuck, on which the substrate is mounted, and a moving optical cleaning arm, positioned over the chuck. The chuck holds the substrate, most preferably by suction, and comprises a motorized system which rotates the chuck about a theta ($\theta$) axis or, alternatively, on x-y axes. The moving arm comprises optics, through which electromagnetic radiation, preferably a laser beam, is conveyed and directed onto the substrate to clean the substrate surface. The arm preferably rotates about a phi ($\Phi$) axis passing through its base, parallel to but displaced from the $\theta$ axis of the chuck. Alternatively, the arm may move on x-y axes. Alternatively, the optical arm may be stationary, and only the chuck moves the substrate so as to place a particle directly under the arm. Similarly, the chuck may be stationary, and only the optical arm moves so as to position itself above a particle on the substrate surface.

The arm motion is preferably coordinated with movement of the moving chuck so that the laser beam can be directed locally at any point on the wafer surface. The cleaning module is connected to an electromagnetic energy source via a radiation guide, which is coupled to convey the energy to the optics of the moving arm. The cleaning module and laser module are herein termed a "particle removal unit".

In some preferred embodiments of the present invention, the arm further comprises channels for vapor or gas-phase transport to the substrate, and suction systems for transfer of gases and residuals from the substrate surface. In one such embodiment, vapor, preferably water vapor, is conveyed to the substrate via the channels in the cleaning arm. In another such embodiment, vapor such as alcohol, or an alcohol:water mixture, is conveyed via the channels in the cleaning arm. A vapor film is thus deposited onto the substrate, which condenses into a thin liquid film. Subsequently, when the electromagnetic energy impinges on the substrate, the liquid film evaporates explosively, as described, for example, in the above-mentioned U.S. Pat. No. 4,987,286. The particle residuals and gas-phase matter are then preferably removed via the cleaning arm. The water vapor thus serves two purposes: to dislodge the particle from the substrate surface by explosive evaporation of the liquid, and to cool the substrate surface, so as to minimize damage.

In some preferred embodiments of the present invention, the particle removal unit is connected to a particle localization unit. The particle localization unit preferably provides the particle removal unit with the coordinates of one or more particles. The contaminated area of the substrate is positioned under the cleaning arm by moving both the substrate and the cleaning arm according the coordinates of the particle. Laser energy is conveyed from the electromagnetic energy source, via the energy guide and the cleaning arm, and then targets the particle according to the information received from the particle localization unit. The energy is fired so as to remove the particle from the substrate surface. The particle removal unit lifts the particle, preferably by suction, and conveys it away from the substrate.

In some preferred embodiments of the present invention, the electromagnetic energy source comprises a multi-wavelength laser source. Preferably, the source combines ultraviolet laser radiation and infrared radiation, most preferably from an Optical Parametric Oscillator (OPO).

In some other preferred embodiments of the present invention, a laser source such as an Er:YAG laser (at 2.94 micron wavelength, for example) may be directed directly from the electromagnetic energy source via the optical arm to the substrate.

The different wavelengths are used individually or in combination, in order to match the energies required to remove a specific type of contaminant from a defined solid-state surface. The infrared radiation is preferably used in conjunction with the vapor film described above.

In some preferred embodiments of this invention, the particle removal unit is integrated into a metrology tool, cluster tool, or other process tool for microelectronics fabrication on a semiconductor wafer. Preferably, the cleaning module is connected to other processing units by a clean wafer transfer system. This integration of the cleaning module in the process system is made possible by the novel, compact design of the moving chuck and arm, making the cleaning module far more compact and non-intrusive than laser-based cleaning units known in the art. The proximity of the particle removal unit to a particle localization unit and/or to other process tools enables fast and effective removal of particles without adding a separate cleaning process step. This integrated laser cleaning reduces the amount of inter-step substrate handling, and thus reduces process time and costs and increases process yield.

BRIEF DESCRIPTION OF THE FIGURES

The present invention will be more fully understood from the following detailed description of the preferred embodiments thereof, taken together with the drawings in which.

DETAILED DESCRIPTION OF PREFERRED EMBODIMENTS

Figure 1:
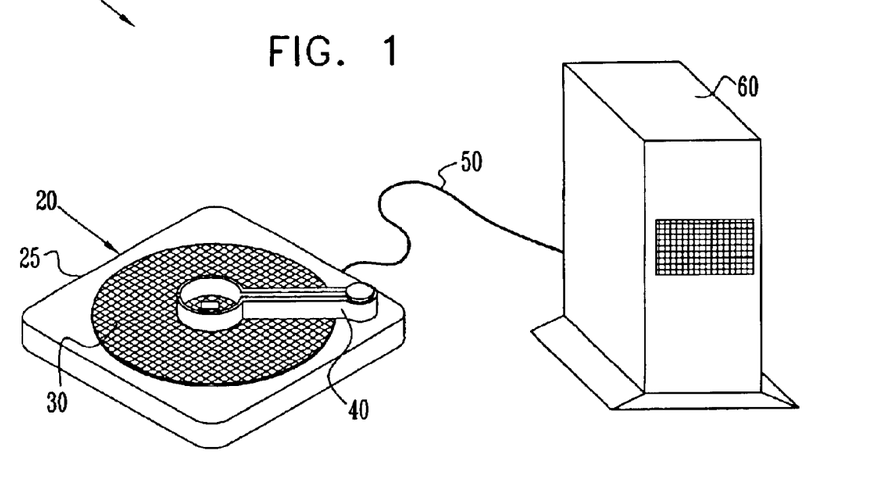
FIG. 1 is a schematic pictorial illustration of a particle removal unit, constructed and operative in accordance with a preferred embodiment of the present invention.

FIG. 1 is a schematic pictorial illustration of a particle removal unit 10, constructed and operative in accordance with a preferred embodiment of the present invention. Unit 10 comprises an in situ particle removal module 20, also referred to herein as a cleaning module. Module 20 comprises a substrate-holding chuck 25 on which a substrate 30 is mounted, and a cleaning arm 40. A single wavelength laser or a multi-wavelength laser module 60 generates a laser beam, which is conveyed to arm 40 via a radiation guide 50.

Substrate 30 is preferably a semiconductor wafer, although the methods and apparatus described hereinbelow are similarly applicable to substrates of other kinds. Module 20 is preferably integrated in situ in a metrology or process tool or with other semiconductor processing equipment, as described hereinbelow. Laser module 60 is preferably remote from the process tool.

Figure 2:
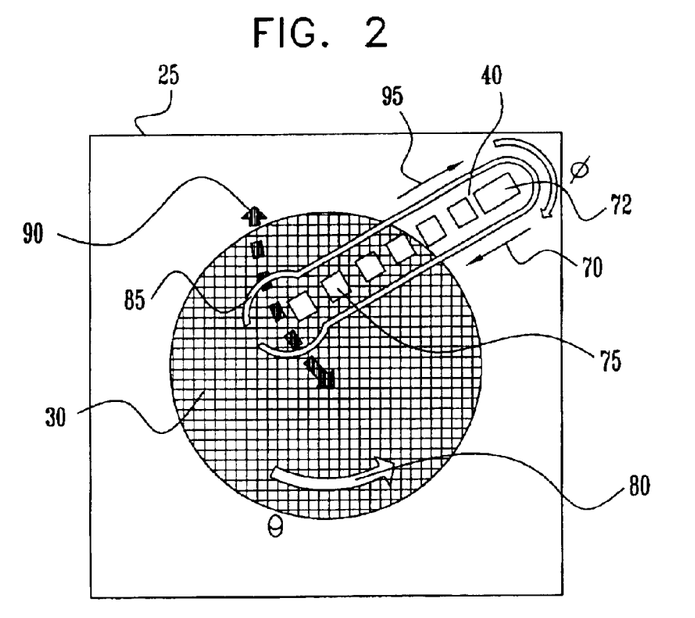
FIG. 2 is a schematic top view of a cleaning module used in the unit of FIG. 1, constructed and operative in accordance with a preferred embodiment of the present invention.

FIG. 2 is a schematic top view of module 20, in accordance with a preferred embodiment of this invention. Substrate 30 is placed on chuck 25, which rotates about a theta (θ) axis 80 at the center of the substrate. Arm 40 moves about a phi (φ) axis 90, which is parallel to but displaced from the θ axis. Arm 40 comprises optics 72 for conveying a laser beam 75 received via radiation guide 50 to the coordinates of a particle on substrate 30. The laser beam may be used in this manner to clean selected points on the substrate, which have been identified as the location of undesired particles, or to scan over and clean the entire substrate.

Preferably, arm 40 also comprises an inlet channel 70 for conveying gas or vapor to substrate 30. Additionally or alternatively, the arm comprises a suction channel 95 and a suction port 85 for removing particle debris, contaminants, liquid and gases from the area of the substrate. Suction port 85 comprises a nozzle, preferably constructed with an aperture of 0.5–3 cm diameter, most preferably 0.5 cm diameter. The nozzle is preferably positioned at a tilt of 25 to 60 degrees and a distance of up to 4 cm from the substrate surface, most preferably approximately 2 cm from the surface.

Figure 3:
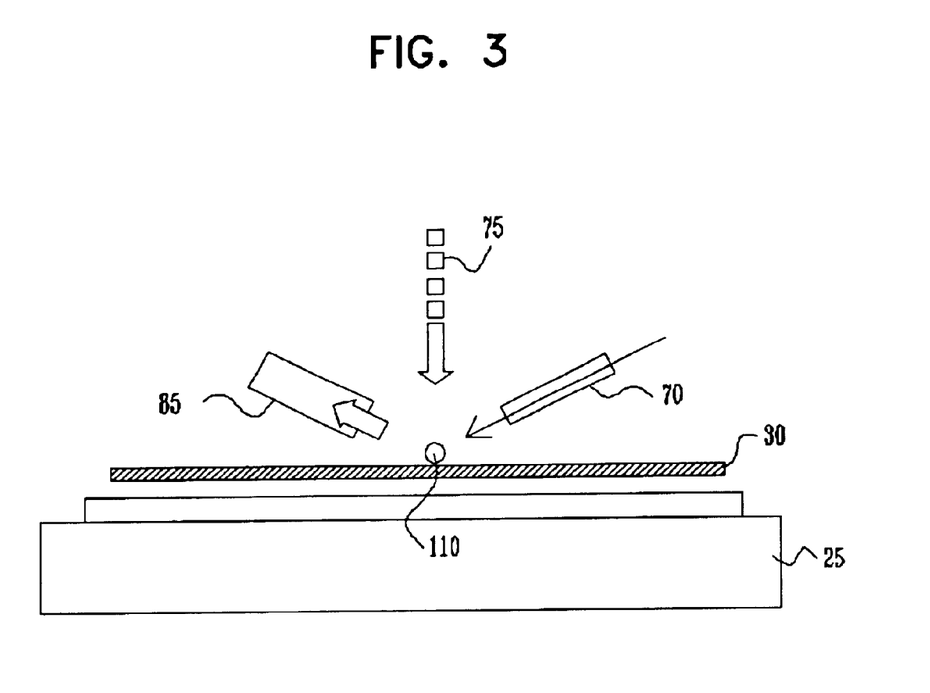
FIG. 3 is a schematic, sectional view of the cleaning module of FIG. 2, illustrating removal of a contaminant particle from the substrate.

FIG. 3 is a schematic, sectional view showing details of module 20 and illustrating removal of a contaminant particle 110 from substrate 30. The laser beam is directed by optics in arm 40 onto the area in which particle 110 is located. A steam pulse is directed onto the area of the particle from inlet channel 70 before laser beam 75 is fired, with contaminated gas, liquid and solid products being removed simultaneously via suction port 85. Preferably, dry gas is conveyed via inlet channel 70 subsequent to the steam flow. The dry gas preferably impinges on substrate's 30 surface, and then preferably flows a suction nozzle (not shown) via tubing to the suction gas outlet 135. in order to dry the tubing.

In other preferred embodiments of this invention, suction is preferably started prior to activating the electromagnetic energy source, preferably laser. The time delay before activating the energy source is preferably 0 to 5 seconds, and most preferably, 0.5 seconds. This enables gas flow lines into the suction nozzle to form. Thereafter, when substrate 30 surface is irradiated, and one or more particles 110 are released, they exhibit a drift diffusion. The particle drift diffusion is controlled by the suction and dry gas flow rate.

Figure 4:
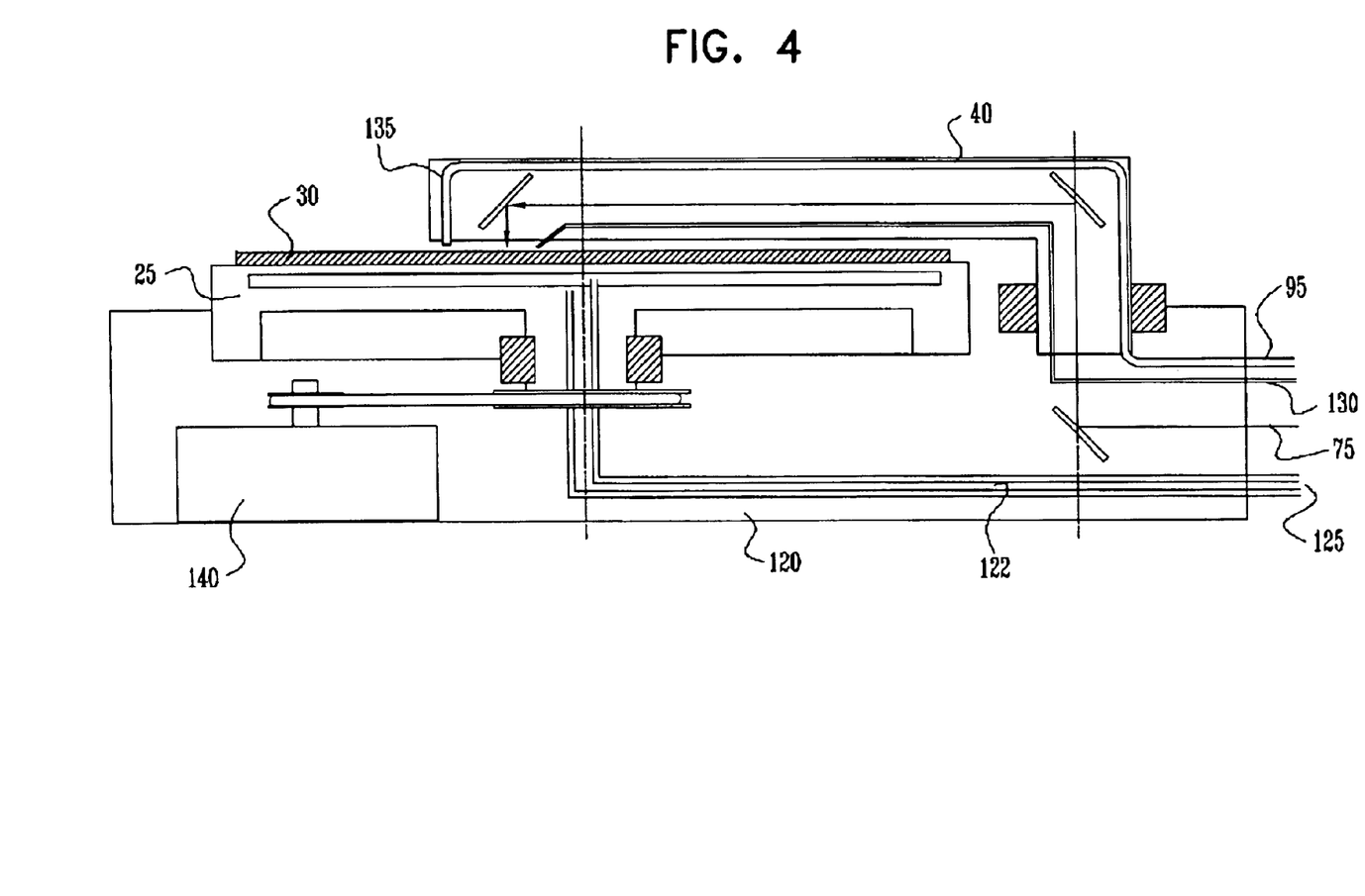
FIG. 4 is a schematic, sectional view of the cleaning module of FIG. 2, showing further details of its construction.

FIG. 4 is a schematic, sectional view of cleaning module 10, showing further details of its construction, in accordance with a preferred embodiment of the present invention. Substrate 30 is preferably held on chuck 25 by a suction mechanism 125. Preferably, a coolant channel 120 conveys a coolant 122, such as water, to chuck 25 in order to cool substrate 30, and thus to prevent thermal damage. Arm 40 conveys laser beam 75 to impinge on substrate 30, and also comprises a vapor inlet 130. Suction channel 95 is connected to a suction gas outlet 135. Rotation of chuck 25 is controlled by a motor 140. Although module 10 is shown here as an independent unit, in an alternative embodiment of the preferred embodiment, arm 40 is incorporated in an existing process chamber or metrology tool and makes use of a rotating chuck or X-Y stage that is already present in the system.

Figure 5A:
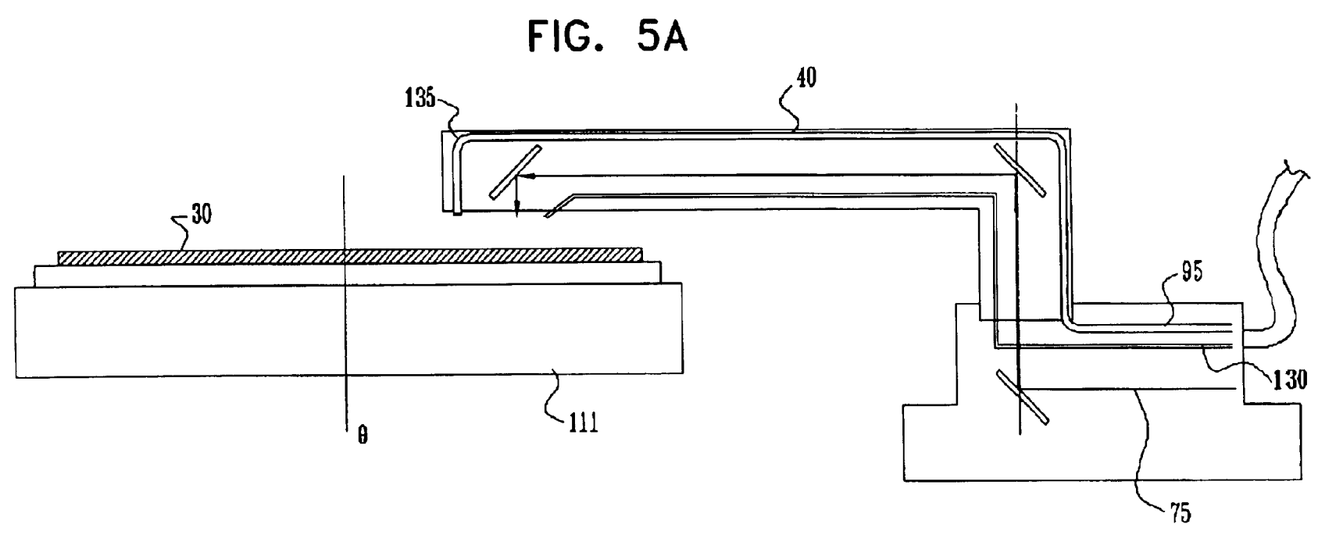
FIG. 5A is a schematic, sectional view of a cleaning module for removal of particles from a substrate during a manufacturing process, in accordance with a preferred embodiment of the present invention.
Figure 5B:
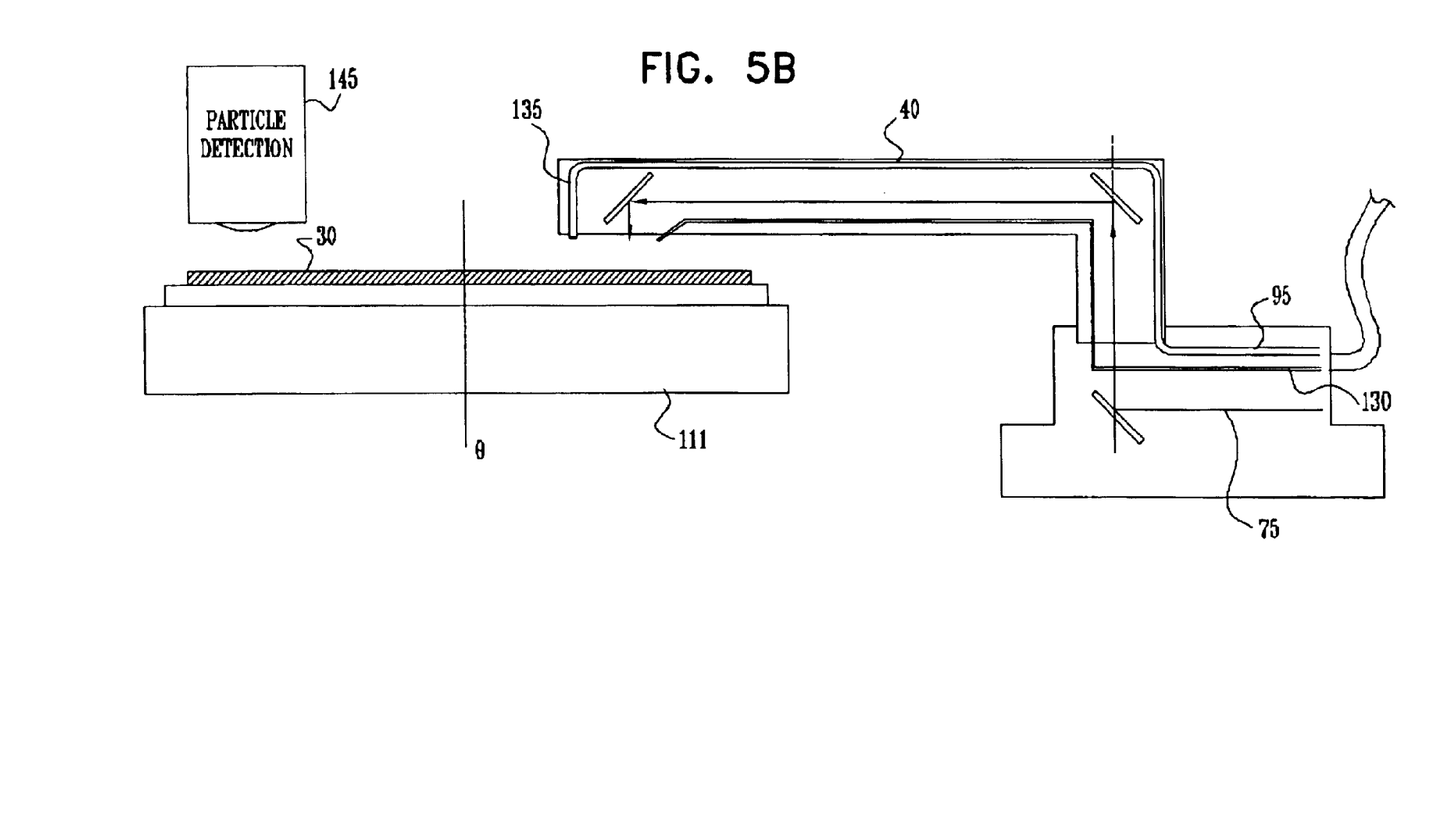
FIG. 5B is a schematic, sectional view of a system combining a cleaning module with a particle detection unit, in accordance with a preferred embodiment of the present invention.

FIG. 5A is a schematic, sectional view of cleaning module 20, in accordance with another preferred embodiment of the present invention. In this embodiment, wafer 30 is mounted on an x-y stage or platform 111. Cleaning arm 40 may rotate about the φ axis, or it may be fixed, since the x-y stage allows the laser beam to reach all areas of the wafer surface without the necessity of scanning the laser beam, as well. The configuration of FIG. 5A is useful in the context of particle detection tools, which commonly include an x-y stage already. A system combining the cleaning module of FIG. 5A with a particle detection unit 145 is shown in FIG. 5B.

Figure 6:
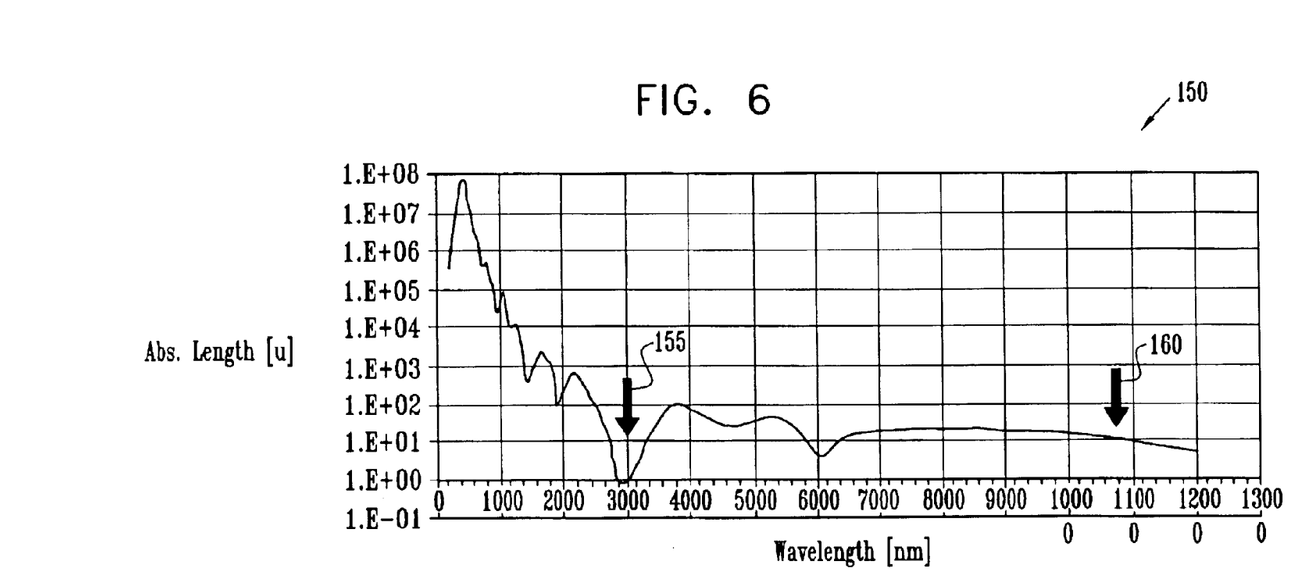
FIG. 6 is a graph showing a water absorption spectrum as a function of wavelength, useful in understanding a preferred embodiment of the present invention.

FIG. 6 is a graph 150 showing a water absorption spectrum as a function of the wavelength of the incident radiation, useful in understanding aspects of the present invention. In order to achieve high absorption of the laser beam in a water film deposited on wafer 30, wavelengths of 10.6 μm and 2.95 μm are preferred, as they are points of strong absorption. The 2.95 μm absorption, indicated in the figure by an arrow 155, is more than one order of magnitude stronger than absorption at 10.6 μm, indicated in the figure by an arrow 160. Preferably, laser module 60 is designed to generate a tuned, pulsed laser beam at wavelengths that are tailored according to the particular particle removal application, including both vapor-assisted and dry methods. Different process stages and contaminant types typically require different methods and different wavelengths for optimal cleaning. Thus, module 60 is preferably able to generate both ultraviolet and infrared (IR) radiation, which is most preferably tunable to the water absorption peak at 2.95 μm.

Figure 7:
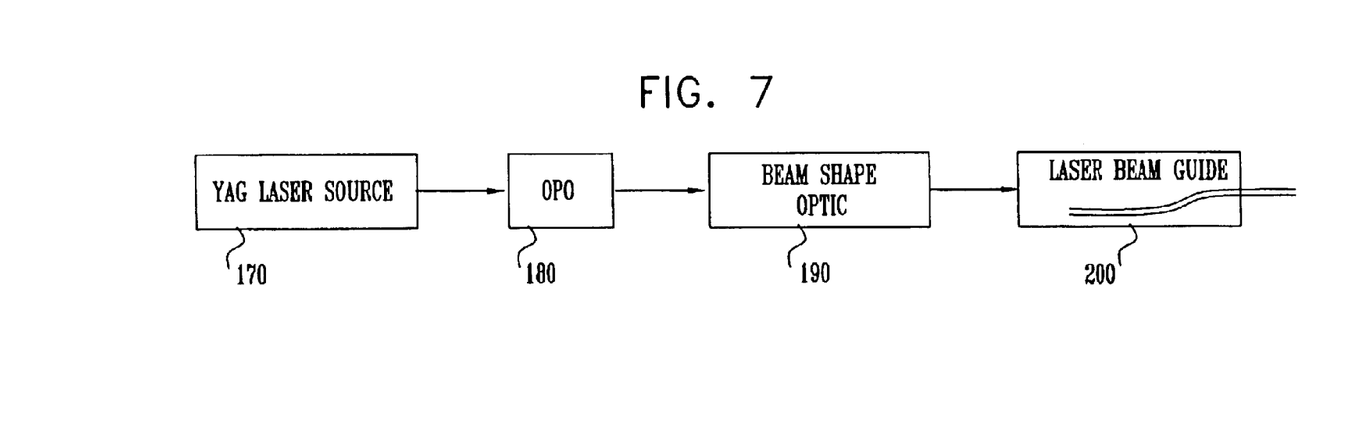
FIG. 7 is a simplified block diagram illustrating a laser source coupled to an optical parametric oscillator, constructed and operative in accordance with a preferred embodiment of the present invention.

FIG. 7 is a simplified block diagram illustrating elements of multi-wavelength laser module 60, constructed and operative in accordance with a preferred embodiment of the present invention. A Nd:YAG laser source 170 emits a laser beam at 1.06 μm, which is directed into an optical parametric oscillator (OPO) 180. The OPO down-converts the laser frequency so as to emit a beam in the mid-IR, at one of the wavelengths at which water has an absorption peak, as shown in FIG. 6. Alternatively, a pulsed $CO_2$ laser (10.6 μm wavelength) can be used instead of the OPO. Beam shaping optics 190 direct the IR beam into a radiation guide 200, which then carries the beam to arm 40. Preferably, module 60 also includes an ultraviolet (UV) laser, such as a Lambda Physik (Gottingen, Germany) LPX315 IMC excimer laser. The UV laser is highly efficient for cleaning bare silicon, while OPO 180 can generate radiation in the strong absorption region of water (2.95 μm) such that "explosive evaporation" conditions are reached and efficient particle cleaning achieved when UV cleaning is ineffective or unsatisfactory for other reasons. Alternatively, an Er:YAG laser may be employed.

In another preferred embodiment of this invention, the OPO and the UV laser operate simultaneously to deliver both IR and UV radiation. The OPO and laser are controlled in order to deliver radiation in amounts that will be sufficient for cleaning but below the damage threshold of the device. Proper control of the IR and UV sources enables particle removal with a lower total amount of energy imparted to substrate 30 than when only a single laser wavelength is used, as in systems known in the art. Lower energy deposition in the substrate reduces the possibility of thermal or radiation damage during cleaning.

Figure 8:
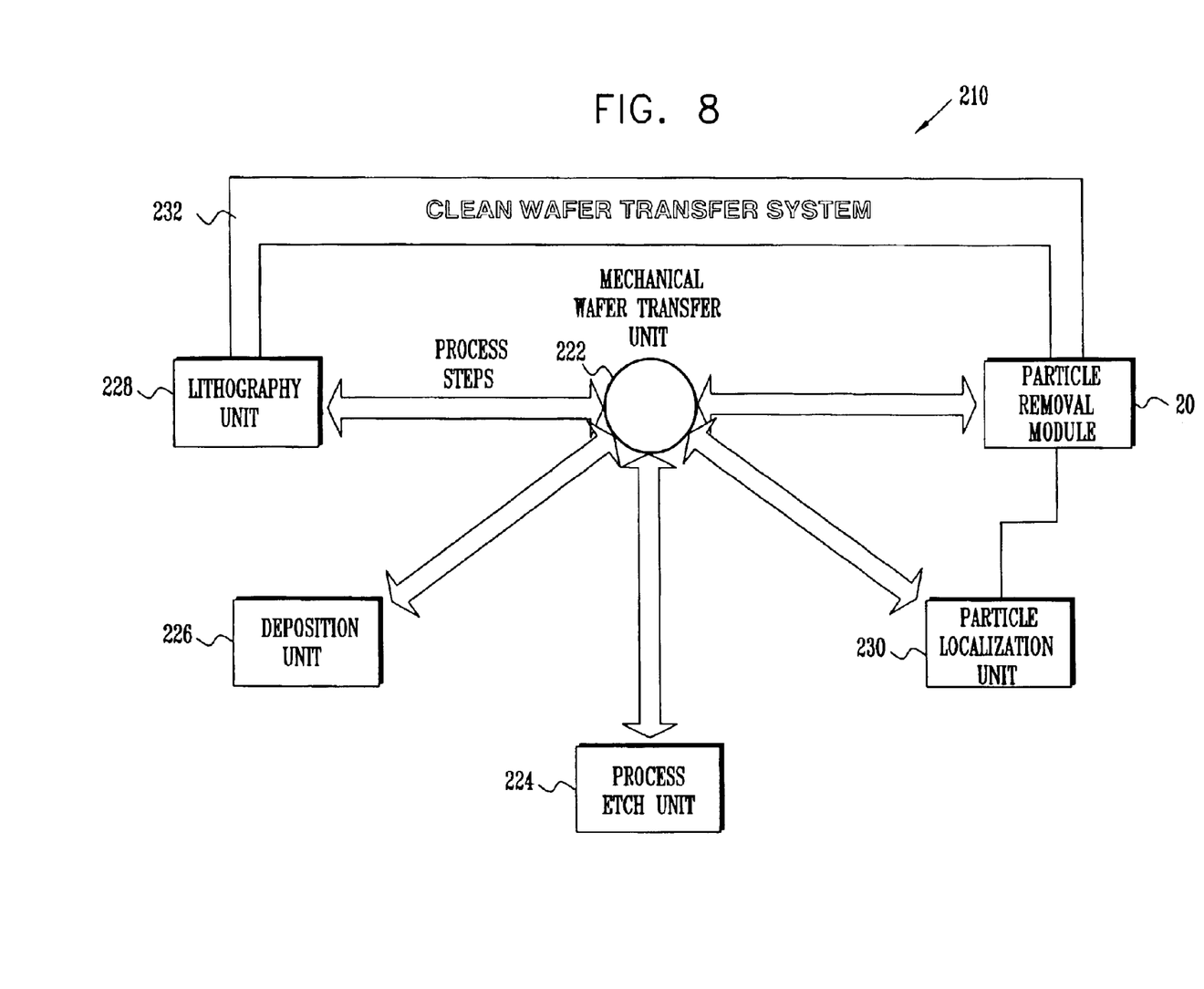
FIG. 8 is a schematic view of a particle removal unit and a particle localization unit integrated into a semiconductor wafer processing cluster tool, constructed and operative in accordance with a preferred embodiment of the present invention.

FIG. 8 schematically illustrates integration of particle removal unit 10 into a cluster tool 210 for semiconductor wafer processing, in accordance with a preferred embodiment of the present invention. Preferably, cluster tool 210 also comprises a particle localization unit 230, which is used to provide coordinates of particles that must be removed from wafer 30 by unit 10. A typical example of particle localization unit 230 is the KLA-Tencor "Surfscan" system.

Wafers are transferred to cleaning module 20 from other process elements in the cluster tool, in order to remove contaminants from the wafers before or after other processing steps. A mechanical wafer transfer unit 222 transfers wafer 30 via a clean wafer transfer system 232 to and from the other process elements. These typically include a process etch unit 224, a deposition unit 226, a lithography unit 228, and the like. After each process or cleaning step, mechanical wafer transfer unit 222 may transfer substrate 30 to the next process unit, or to particle localization unit to locate any further particles, and then to the cleaning module 20 to be cleaned again. When particle removal unit 10 receives information concerning the location of particles from particle localization unit 230, it can then perform very localized cleaning, and does not need to clean the whole wafer surface.

At the end of all the unit processes in the cluster tool, mechanical wafer transfer unit 222 transfers substrate 30 via clean wafer transfer system 232 to the cluster tool exit.

Thus, the laser-cleaning system comprising particle localization unit 230 and particle removal unit 10 can be used to clean a substrate in situ. This cleaning may take place at the front end of a process line [FEOL], at the back end of the line [BEOL], simultaneously with, during, or after a process, simultaneously with a measuring process, or prior, during, or after a measuring process. Process examples include, but are not limited to, pre-deposition, post-deposition, before and after lithography, development and etch processes, and before, during and after measurement processes. Two typical options are exemplified in FIGS. 9 and 10.

Figure 9:
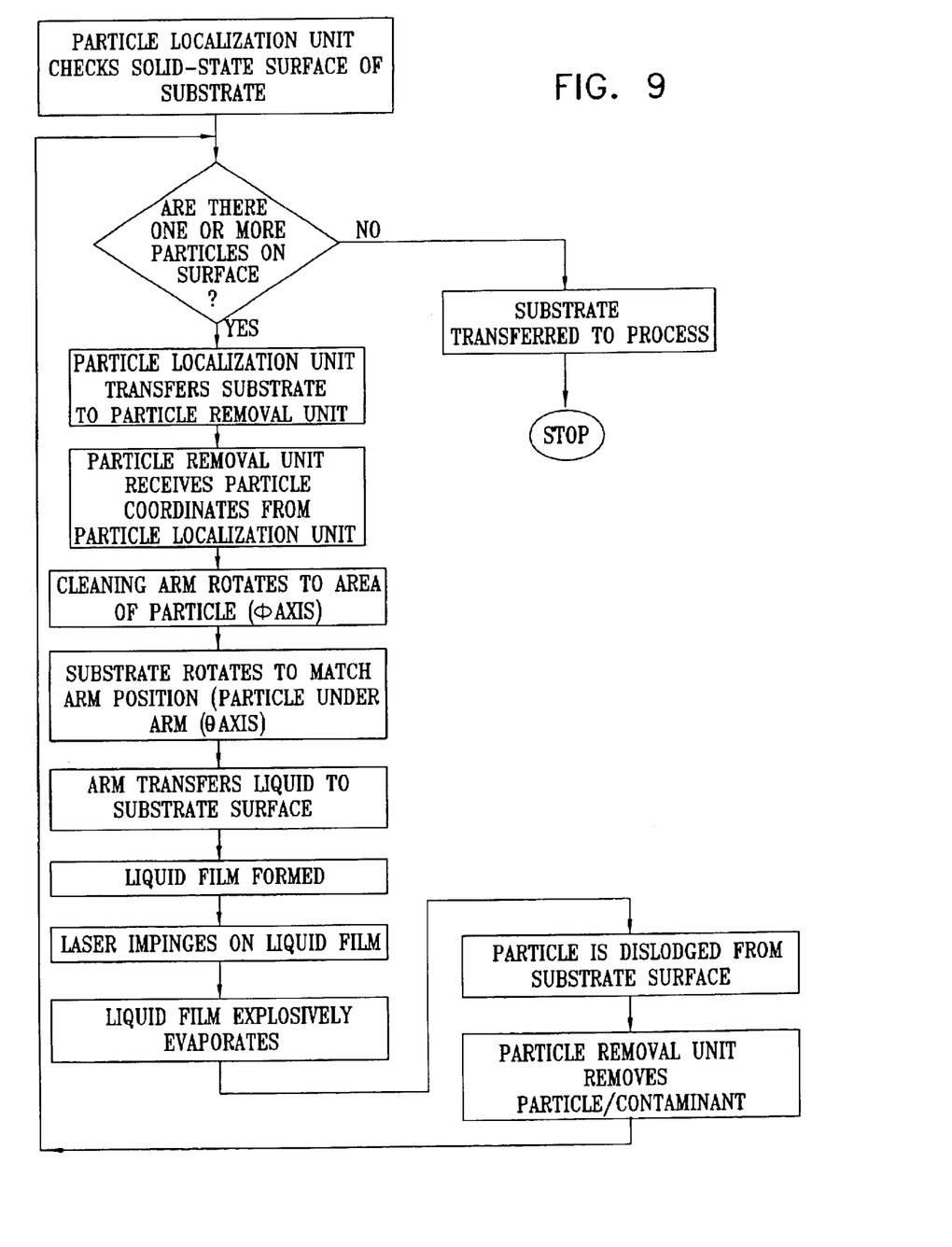
FIG. 9 is a flow chart showing a method of substrate cleaning, in accordance with a preferred embodiment of the present invention.

FIG. 9 is a flow chart showing a typical sequence of substrate cleaning employing particle removal unit 10 in situ prior to a process in accordance with a preferred embodiment of the present invention. Particle localization unit 230 checks substrate 30 surface for particle 110. Particle 110 may be external contaminant such as dust, microbe, photoresist residues from prior processing, and the like. When particle localization unit 230 finds one or more particles 110 on the surface of substrate 30, it transfers substrate 30 to particle removal unit 10. Particle localization unit 230 relays coordinates of particle 110 to particle removal unit 10. Preferably, cleaning arm 40 rotates about phi ($\phi$) axis 90 to the area of particle 110 on substrate 30. Substrate 30, mounted on substrate chuck 25, may also move about theta ($\theta$) axis 80 according to the coordinates of particle 110 received from particle localization unit 230.

Cleaning arm 40 then conveys steam 70 to the surface of substrate 30. The water vapor condenses on impact with substrate 30, and a liquid film is formed. The liquid film may cover parts or all of the surface of substrate 30. Laser beam 75, is conveyed from multi-wavelength laser module 60 via radiation guide 50 and through cleaning arm 40 onto the liquid film. The liquid film explosively evaporates, dislodging particle 110 from the surface of substrate 30. Particle 110 and/or particle remnants are preferably carried by airflow, or sucked into the channel in cleaning arm 40 and are ejected at suction gas outlet 135 of cleaning module 20.

The above process is repeated until all particles have been removed from the substrate surface.

Particle localization unit 230 preferably has electromechanical systems for substrate transfer. Substrate transfer may alternatively be manual, or be part of mechanical wafer transfer unit 222 of cluster tool 210. The wafer may be transferred to a holding stage or to another process unit, such as a process etch unit 224, a deposition unit 226, a lithography unit 228, or the like.

Figure 10:
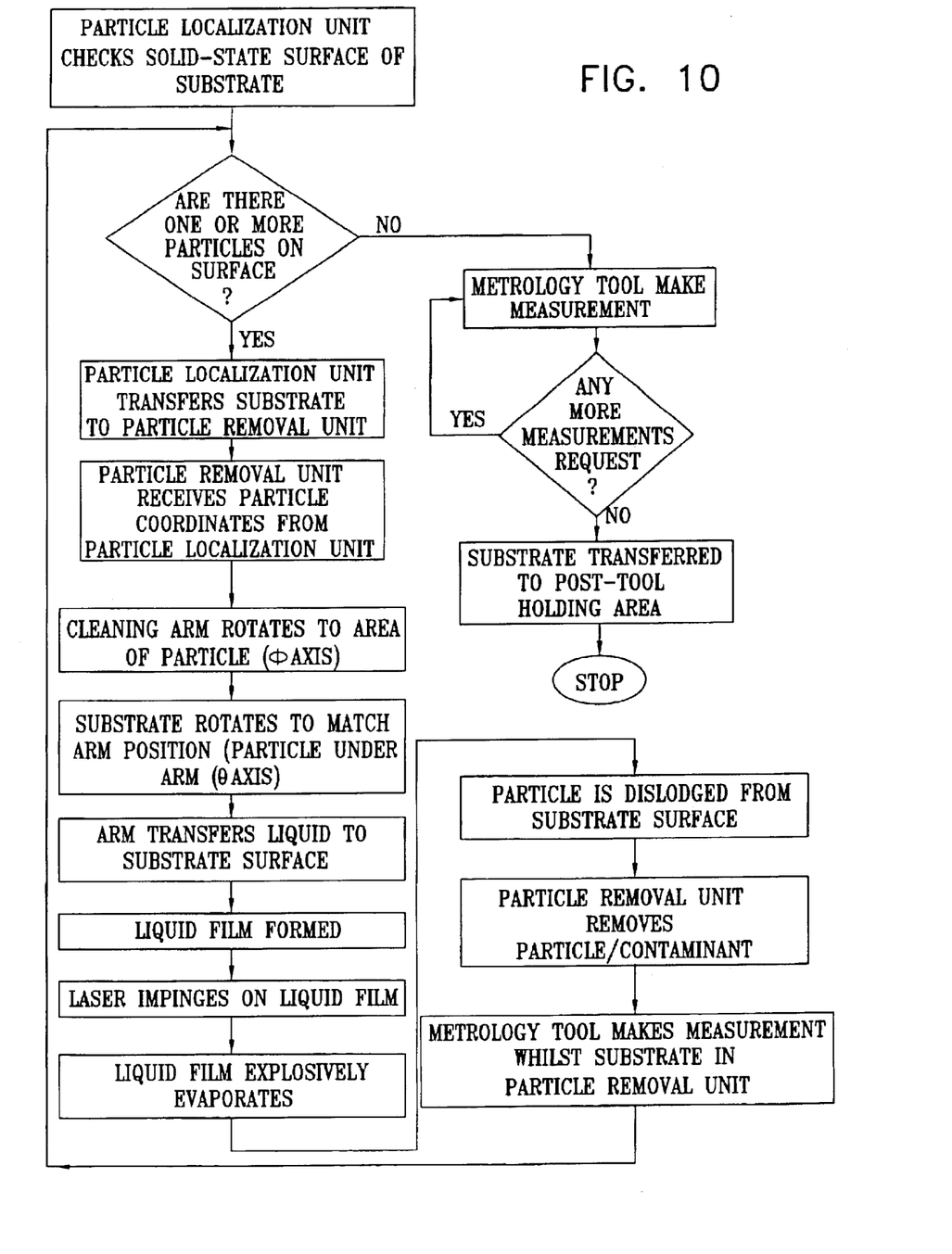
FIG. 10 is a flow chart showing a method of substrate cleaning, in accordance with another preferred embodiment of the present invention.

FIG. 10 is a flow chart illustrating a typical sequence of substrate cleaning employing particle removal unit 10 in situ simultaneously with a metrology process, in accordance with a preferred embodiment of the present invention. For example in a slow measuring process, such as microscopic measurement of dimensions of elements on substrate 30, or electrical measurements on a substrate, it is preferable to utilize the time to remove the particles simultaneously. The sequence of FIG. 10 is thus substantially similar to that of FIG. 9, except that in FIG. 10 the particle location and removal processes are interleaved, rather than serial. While unit 10 is operating, a metrology tool, such as a remote microscope, takes measurements of various elements on the surface of substrate 30. It is preferable that the movement of the microscope is coordinated with that of arm 40. The metrology tool continues to take measurements until all particles have been removed, and no more measurements are required.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for removing particles from the surface of a substrate, comprising:

a processing chamber;

a particle localization unit, which is adapted to scan the surface of the substrate in the processing chamber, in order to determine locations of particles on the surface in first and second regions of the surface;

an optical arm, which is adapted to direct a beam of electromagnetic energy onto the surface of the substrate while the substrate is in the processing chamber, simultaneously with scanning of the surface by the particle localization unit, causing the particles to be dislodged from the surface; and a moving chuck, which is configured to receive the substrate and to move the substrate within the processing chamber relative to the particle localization unit so as to cause the particle location unit to scan the surface of the substrate, and to position the substrate relative to the optical arm so as to cause the beam to impinge upon the locations of the particles in the first region of the surface that are determined by the particle localization unit, while the particle localization unit scans over the second region.

2. Apparatus according to claim 1, wherein the optical arm is adapted to rotate about a base thereof so as to scan the beam according to the particle locations.

3. Apparatus according to claim 1, wherein the electromagnetic energy comprises laser energy.

4. Apparatus according to claim 3, and comprising a laser module adapted to generate the laser energy and a radiation guide coupled from the laser module to the optical arm by so as to supply the beam of electromagnetic energy thereto.

5. Apparatus according to claim 4, wherein the laser module comprises a multi-wavelength laser module, which is adapted to supply the electromagnetic energy at a plurality of wavelengths.

6. Apparatus according to claim 4, wherein the laser energy comprises infrared radiation.

7. Apparatus according to claim 4, wherein the laser module comprises an Optical Parametric Oscillator (O.P.O.) which is tunable to match the energies required to remove a specific type of contaminant from the surface.

8. Apparatus according to claim 4, wherein the laser energy is Er:YAG laser energy.

9. Apparatus according to claim 4, wherein the laser energy is $CO_2$ laser energy.

10. Apparatus according to claim 1, wherein the optical arm comprises a channel for conveying a vapor to the surface of the substrate.

11. Apparatus according to claim 10, wherein and the channel terminates in a nozzle adjacent to the substrate surface.

12. Apparatus according to claim 1, wherein the optical arm comprises an outlet channel, which is adapted to be coupled to a suction system.

13. Apparatus according to claim 12, wherein the outlet channel comprises a suction nozzle adjacent to the substrate surface.

14. Apparatus according to claim 13, wherein the suction nozzle has an aperture of approximately 0.5 to 3 cm.

15. Apparatus according to claim 13, wherein suction nozzle is held no more than 4 cm above the substrate surface.

16. Apparatus according to claim 15, wherein the suction nozzle is placed approximately 2 cm above the substrate surface.

17. Apparatus according to claim 1, wherein the chuck is adapted to rotate in a plane of the substrate about a central axis thereof.

18. Apparatus according to claim 1, wherein the chuck is adapted to move linearly in a plane of the substrate along x and y axes.

19. Apparatus according to claim 1, wherein the arm is adapted to rotate about a base thereof in a plane parallel to the substrate.

20. Apparatus according to claim 1, wherein the substrate comprises a semiconductor wafer.

* * * * *